United States Patent [19]

Liaw et al.

[11] Patent Number: 5,780,331
[45] Date of Patent: Jul. 14, 1998

[54] METHOD OF MAKING BURIED CONTACT STRUCTURE FOR A MOSFET DEVICE IN AN SRAM CELL

[75] Inventors: Jhon-Jhy Liaw, Taipei; Jin-Yuan Lee, Hsin-Chu, both of Taiwan

[73] Assignee: Taiwan Semiconductor Manufacturing Company Ltd., Hsin-Chu, Taiwan

[21] Appl. No.: 783,980

[22] Filed: Jan. 15, 1997

[51] Int. Cl.[6] ............................................. H01L 21/8244
[52] U.S. Cl. ........................ 438/238; 438/586; 438/649
[58] Field of Search ........................... 438/238, 381, 438/382, 586, 647, 648, 649

[56] References Cited

U.S. PATENT DOCUMENTS

| | | | |
|---|---|---|---|
| 4,950,620 | 8/1990 | Harrington, III | 437/60 |
| 5,168,076 | 12/1992 | Godinho et al. | 438/647 |
| 5,298,782 | 3/1994 | Sundaresan | 257/393 |
| 5,480,837 | 1/1996 | Liaw et al. | 437/193 |
| 5,605,853 | 2/1997 | Yoo et al. | 438/238 |

Primary Examiner—Chandra Chaudhari
Attorney, Agent, or Firm—George O. Saile; Stephen B. Ackerman

[57] ABSTRACT

A process for creating a buried contact structure, for a MOSFET device, to be used in an SRAM cell, has been developed. The process features using a thick tungsten silicide layer, on the sides of a split polysilicon shape, followed by a series of selective, anisotropic RIE procedures, used to create a buried contact structure without crevicing or trenching of the semiconductor substrate, in an region adjacent to the buried contact structure.

19 Claims, 4 Drawing Sheets

METHOD OF MAKING BURIED CONTACT STRUCTURE FOR A MOSFET DEVICE IN AN SRAM CELL

BACKGROUND OF THE INVENTION

(1). FIELD OF THE INVENTION

The present invention relates to a semiconductor fabrication process used to create a static random access memory, (SRAM), cell, and more specifically to an improved buried contact structure, used for a metal oxide semiconductor field effect transistor, (MOSFET), device, used in the SRAM cell.

(2). DESCRIPTION OF PRIOR ART

Static random access memory, (SRAM), cells are now being fabricated using high speed, high density, complimentary metal oxide semiconductor, (CMOS), devices. Conventional SRAM cells are usually configured using either four n-channel, (NFET), and two p-channel, (PFET), MOSFET devices, or configured with four NFET, and two resistor load devices. The four NFET, two resistor load SRAM configuration consumes less area then counterparts using both NFET and PFET devices, and thus has been used extensively. In addition a buried contact concept, allowing connection between the drain region of an access transistor, and the gate of the driver transistor, in the semiconductor substrate, further reduces the consumption of area needed for the SRAM cell, when compared to counterparts created using conventional metal interconnects.

The buried contact concept features initially placing a buried contact region in the semiconductor substrate, subsequently connecting to an adjacent, MOSFET, source and drain region. The contact structure to the buried contact region, as well as the gate structure, are usually formed during the same patterning process, and it is possible that with a small photolithographic mis-alignment, an over etched region can be created in the buried contact region, at the edge of the buried contact structure, in an area between the buried contact structure and the gate structure. This over etched region, or trench, existing in the buried contact region, can present topographical problems when ion implanting the source and drain species into the trenched or creviced region. A decrease in the dopant concentration in this creviced region, results in a decreased linkup between the buried contact region and the MOSFET source and drain region, resulting in increased resistance, and reduced SRAM performance.

This invention will describe a process for creating a contact structure to an underlying buried contact region, in which the adverse effects of a mis-alignment of the contact structure, is eliminated, resulting in an elimination of trenching of the buried contact region. A combination of a thick underlying polysilicon layer, used as the split polysilicon layer, and a thick overlying metal silicide layer, as well as the use of a selective dry etch ambient, etching polysilicon at a faster rate then metal silicide, results in a tab of metal silicide layer, protecting the buried contact region, during the etching of the exposed residual polysilicon layer. Prior art such as Sundaresan, in U.S. Pat. No. 5,298,782, describe a process for fabricating SRAM cells with a polysilicon load resistor, however this prior art does not teach the use of buried contact regions, or a process for avoiding the trenching of the buried contact region, during metal silicidepolysilicon gate structure, and buried contact structure patterning.

SUMMARY OF THE INVENTION

It is an object of this invention to fabricate an n-channel, MOSFET device, and a polysilicon load resistor, for an SRAM cell.

It is another object of this invention to use a buried contact structure, for connection between elements of n-channel MOSFET devices.

It is yet another object of this invention to use a thick, split polysilicon layer, a thick metal silicide layer, and a reactive ion etch ambient, selective in terms of etching polysilicon at a greater rate then the rate of etching of metal silicide, thus reducing the risk of trenching during the patterning of the buried contact, and metal silicide - polysilicon, (polycide), gate structures.

In accordance with the present invention, a method is described for forming buried contact structures, to underlying buried contact regions, using a process that reduces the risk of trenching the semiconductor substrate during the patterning procedure used to define the buried contact structure, and the polycide gate structure. Thick filed oxide regions are grown for purposes of isolation, followed by the growth of a gate insulator layer, on regions of the semiconductor substrate not covered by the thick field oxide regions. A layer of polysilicon is deposited and patterned, via photolithographic and dry etching processes, to define a buried contact opening in the polysilicon layer, and in the underlying gate insulator. An ion implantation procedure is used to create a buried contact region, in the semiconductor substrate, in a region defined by the opening in the polysilicon and gate insulator layers. A metal silicide layer is then deposited on the underlying polysilicon layer, and on the buried contact region, with a thicker metal silicide layer formed on the side of the polysilicon layer, in the buried contact opening. A first photoresist shape is formed on the metal silicide-polysilicon layers, defining the region for a subsequent polycide structure, while a second photoresist shape is formed on the thicker metal silicide layer, overlying the buried contact region, defining the region for a subsequent buried contact structure. A first reactive ion etching, (RIE), procedure is used to etch the metal silicide layer, and a portion of the polysilicon layer, for the subsequent polycide gate structure, while the same procedure is used to etch the top portion of the thicker metal silicide layer, for the buried contact structure. A second RIE procedure is next employed, using an etch chemistry which removes polysilicon at a greater rate then the removal rate of metal silicide. The second RIE procedure removes the remaining portion of exposed polysilicon, creating a polycide structure, and a space between the polycide structure and the buried contact structure. The buried contact structure exhibits thick metal silicide, formed via RIE procedures and defined by the second photoresist shape, and also includes an unetched tab of metal silicide, created during the first RIE procedure, which removed only the top portion of the exposed thicker metal silicide layer, with the metal silicide tab protecting the underlying buried contact region during the second RIE procedure. A lightly doped source and drain region is next formed, followed by creation of insulator spacers on the sides of the polycide gate structure, as well as on the sides of the buried contact structure. Heavily doped source and drain regions are next formed, including formation of the heavily doped source and drain region in the space between the buried contact region and the polycide gate structure of the MOSFET device. An interlevel insulator layer is deposited, followed by the deposition of polysilicon layer, and patterning of the polysilicon layer to create a polysilicon load resistor. A thick insulator layer is next deposited, followed by patterning to open holes in the thick insulator layer, exposing the polysilicon load resistor, buried contact, and polycide gate structures. Metal deposition and patterning are then used to create metal contact structures and interconnects to the polysilicon load resistor, buried contact and polycide gate structures.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The method for creating a buried contact structure, for a MOSFET device, used in an SRAM cell, in which a novel buried contact structure process is used to reduce the risk of trenching of exposed semiconductor during the patterning of the buried contact structure, will now be described.

Figure 1:
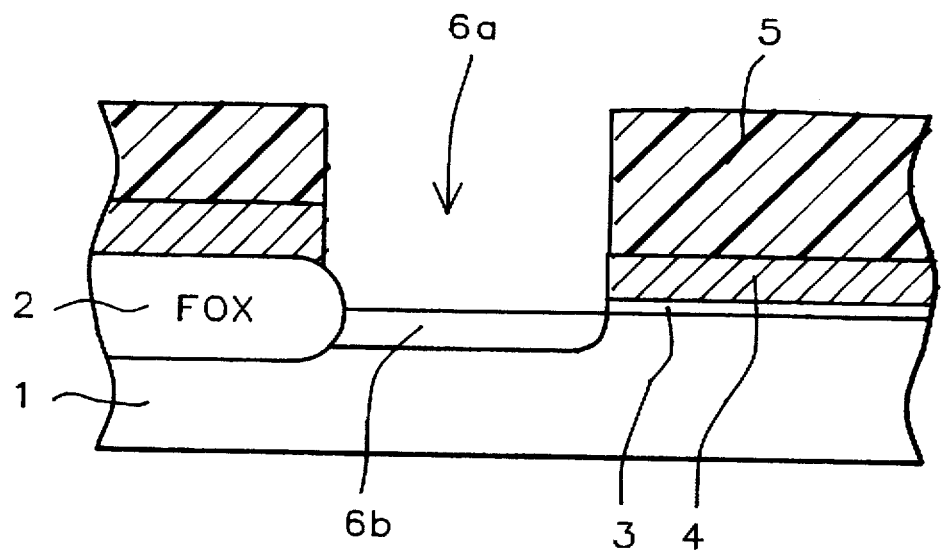
FIGS. 1–7, which schematically, in cross-sectional style, show the key stages of fabrication of a MOSFET device, and a polysilicon load resistor, used for an SRAM cell, using a novel buried contact structure process, offering reduced risk of semiconductor trenching during the patterning of the buried contact structure.

A semiconductor substrate, 1, P type, comprised of single crystalline silicon exhibiting a <100> crystallographic orientation, is used and schematically shown in FIG. 1. A thick field oxide, (FOX), region, 2, is formed for isolation purposes. FOX region, 2, is created via thermal oxidation of exposed semiconductor substrate regions, in an oxygen-steam ambient, at a temperature between about 850° to 1050° C., to a thickness between about 3000 to 5000 Angstroms. The regions of semiconductor substrate, 1, not exposed to the FOX oxidation procedure, were protected by a composite oxidation resistant mask of silicon nitride-silicon oxide. After removal of the composite oxidation resistant mask, using hot phosphoric acid for silicon nitride removal and a buffered hydrofluoric acid solution for the underlying silicon oxide layer, a silicon dioxide, gate insulator layer, 3, is thermally grown in an oxygen-steam ambient, at a temperature between about 850° to 1000° C., to a thickness between about 50 to 200 Angstroms. A first polysilicon layer, 4, is next deposited, using low pressure chemical vapor deposition, (LPCVD), procedures, at a temperature between about 500° to 700° C., to a thickness between about 750 to 1250 Angstroms, using silane as a source. First polysilicon layer, 4, is grown using in situ doping techniques, via the addition of either arsine or phosphine to the silane ambient. Photolithographic procedures are then used to create photoresist shape, 5, allowing buried contact opening, 6a, to be created in first polysilicon layer, 4, forming split polysilicon shape, 4, and silicon dioxide layer, 3, via reactive ion etching, (RIE), using $Cl_2$ as an etchant to create split polysilicon shape, 4, and using $CHF_3$ as an etchant for silicon dioxide layer, 3. An ion implantation of phosphorous is next performed, at an energy between about 20 to 80 KeV, at a dose between about 1E14 to 3E15 atoms/$cm^2$, using photoresist shape, 5, as a mask, creating buried contact region, 6b. This is schematically shown in FIG. 1.

Figure 2:
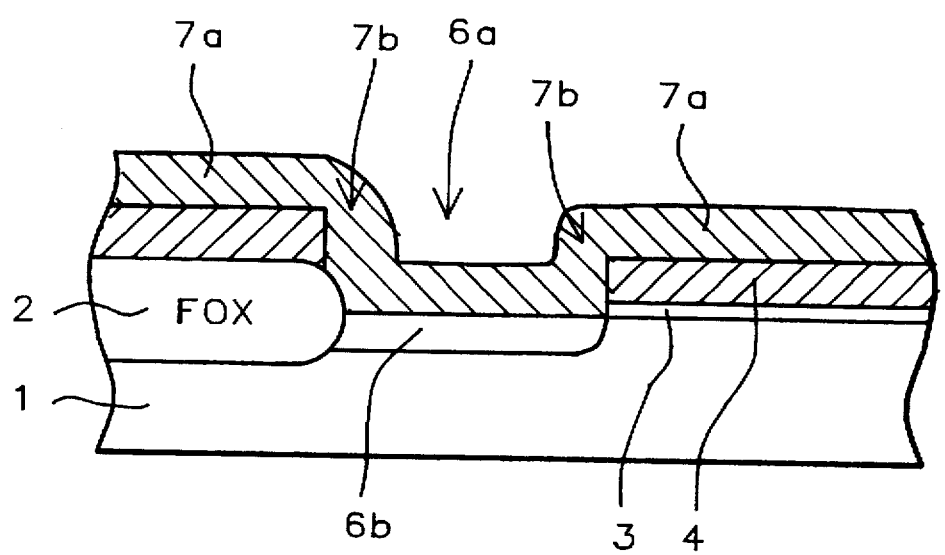

After removal of photoresist shape, 5, via plasma oxygen ashing and careful wet cleans, a layer of tungsten silicide, 7a, is deposited, using LPCVD procedures, at a temperature between about 400° to 500° C., to a thickness between about 750 to 1250 Angstroms, using silane and tungsten hexafluoride as a source. In the buried contact opening, 6a, where tungsten silicide layer, 7a, deposited on the sides of split polysilicon shape, 4, a thicker layer, 7b, of tungsten silicide, between about 1500 to 2500 Angstroms, resulted. This is schematically displayed in FIG. 2. Another option is the use of a composite layer of an underlying in situ doped polysilicon layer, between about 25 to 75 Angstroms in thickness, and an overlying tungsten silicide layer, again between about 750 to 1250 Angstroms. This option, again using LPCVD procedures, at a temperature between about 400 to 500° C., and using silane as a source for the underlying polysilicon layer, and silane and tungsten hexafluoride as a source for the tungsten silicide layer, can be used in place of tungsten silicide layer, 7a, option.

Figure 3:
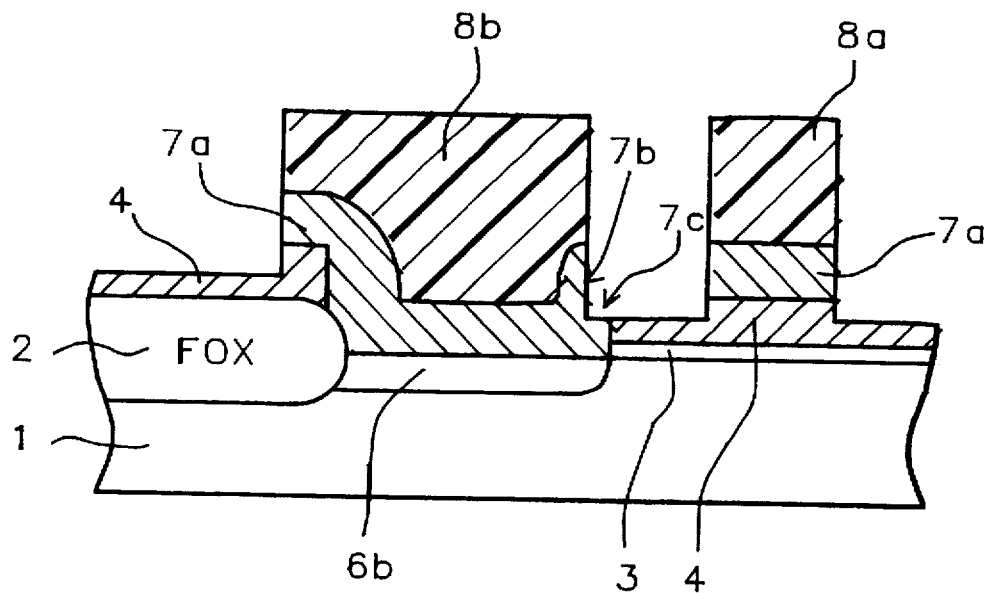

Photolithographic procedures are next used to form photoresist shape, 8a, to be used to define a subsequent polycide gate structure, and photoresist shape, 8b, to be used to define a subsequent buried contact structure. This is shown schematically in FIG. 3. A first RIE procedure, using $Cl_2$, in $N_2$ as an etchant, at a power between about 170 to 250 watts, and at a pressure between about 3 to 5 milliTorr, is used to completely remove tungsten silicide layer, 7a, and a top portion of the underlying split polysilicon shape, 4, for the polycide gate structure, defined using photoresist shape, 8a, as a mask. A thin portion of split polysilicon shape, 4, between about 200 to 600 Angstroms in thickness, still remains in unmasked, or exposed regions, regions unprotected by photoresist shapes and regions in which split polysilicon shape, 4, existed. The same first RIE procedure removes between about 1250 to 1500 Angstroms of thick tungsten silicide layer, 7b, leaving a thin tab of tungsten silicide, 7c, between about 250 to 1250 Angstroms in thickness, in regions where thick tungsten silicide layer, 7b, was not protected by photoresist shape, 8b. The result of the first RIE procedure is shown schematically in FIG. 3.

Figure 4:
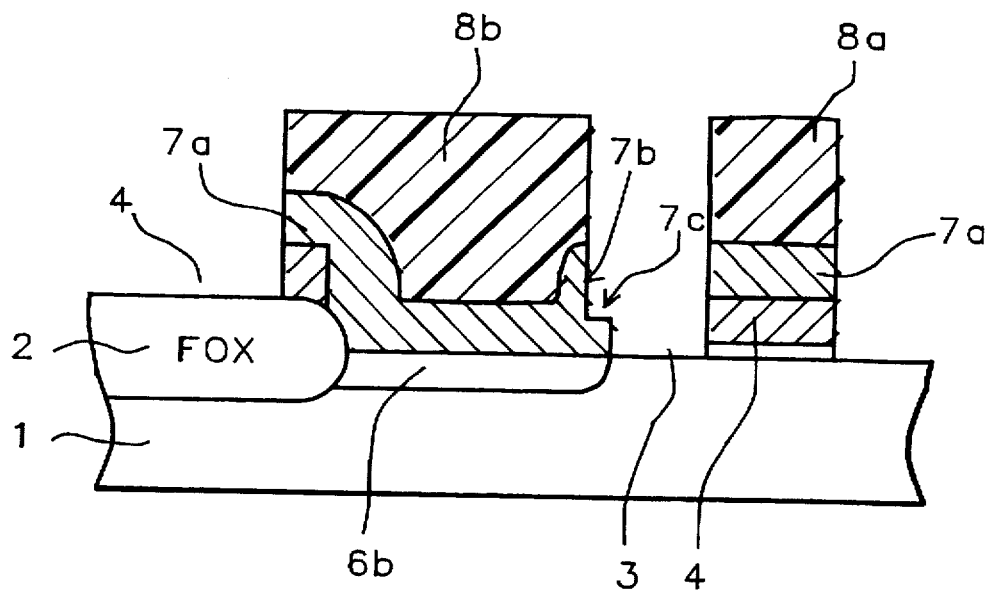

A second RIE procedure, using HBr and He as etchants, at a power between about 180 to 250 watts, and at a pressure between about 50 to 70 milliTorr, are used to remove the thin portions of split polysilicon shape, 4, remaining after the first RIE procedure, and not protected by photoresist shapes, forming polycide gate structure, 20, and buried contact structure, 21. The RIE chemistry used for the polysilicon removal is selective, removing polysilicon at a rate between about 30 to 100 times faster then the etch rate for tungsten silicide. Therefore the thin tab of tungsten silicide, 7c, is not completely removed, remaining to protect the underlying buried contact region, 6b, from RIE attack, thus eliminating a trenching or crevicing effect which may have occurred with a less selective RIE chemistry and a thinner tungsten silicide layer. This is schematically shown in FIG. 4.

Figure 5:
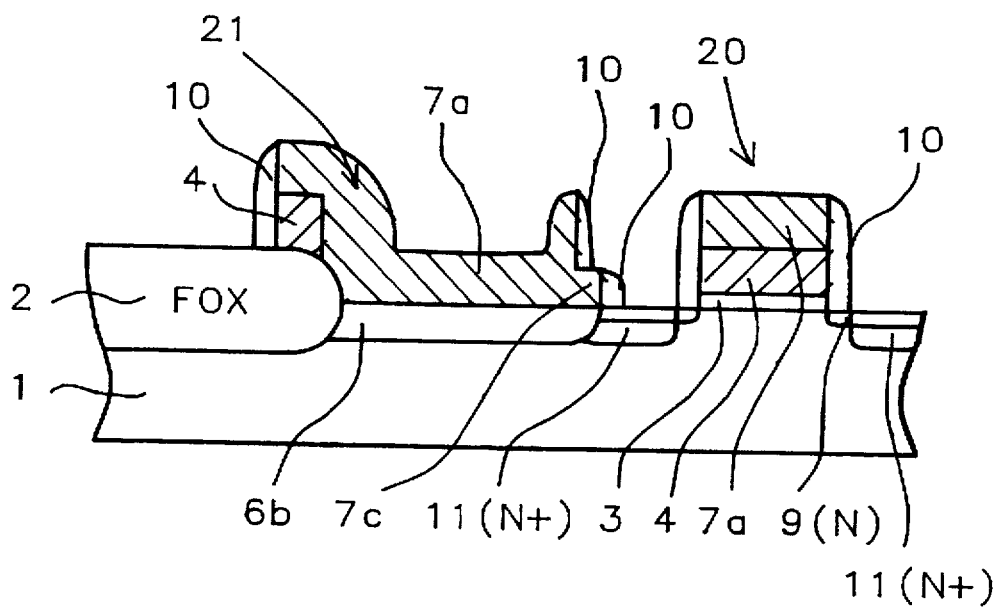

After removal of photoresist shapes, 8a, and 8b, using plasma oxygen ashing and careful wet cleans, a lightly doped source and drain region, 9, is formed in regions of semiconductor substrate, 1, not covered by FOX regions, 2, not covered by polycide gate structure, 20, and not covered by buried contact structure, 21. The lightly doped source and drain region is formed via ion implantation of arsenic or phosphorous, at an energy between about 25 to 75 KeV, at a dose between about 7E13 to 7E14 atoms/$cm^2$. A layer of silicon oxide is next deposited using either LPCVD or plasma enhanced chemical vapor deposition, (PECVD), procedures, at a temperature between about 500° to 700° C., to a thickness between about 1000 to 3000 Angstroms, using tetraethylorthosilicate, (TEOS), as a source. An anisotropic RIE procedure, using $CHF_3$ as an etchant, is used to create silicon oxide spacers, 10, on the sides of the polycide gate structure, 20, as well as on the sides of buried contact structure, 21, schematically shown in FIG. 5. Also shown in FIG. 5, is the creation of a heavily doped source and drain region, 11, formed in regions of semiconductor substrate, 1, not covered by FOX regions, 2, not by polycide gate structure, 20, or buried contact structure, 21, and not covered by silicon oxide spacers, 10. The heavily doped source and drain region, 11, obtained via ion implantation of either arsenic or phosphorous, at an energy between about 30 to 100 KeV, at a dose between about 1E15 to 6E15 atoms/cm$^2$, produces a conductive link between the buried contact region, 6b, and the gate region underlying polycide gate structure, 20. If thin tab of tungsten silicide, 7c, was not present during the patterning of the buried contact structure, 21, and the polycide gate structure, 20, trenching or crevicing at the edge of the buried contact structure may have occurred, making it difficult to form a heavily doped source and drain region, via ion implantation procedures, in the trenched region, resulting a decreased link-up to the buried contact region.

Figure 6:
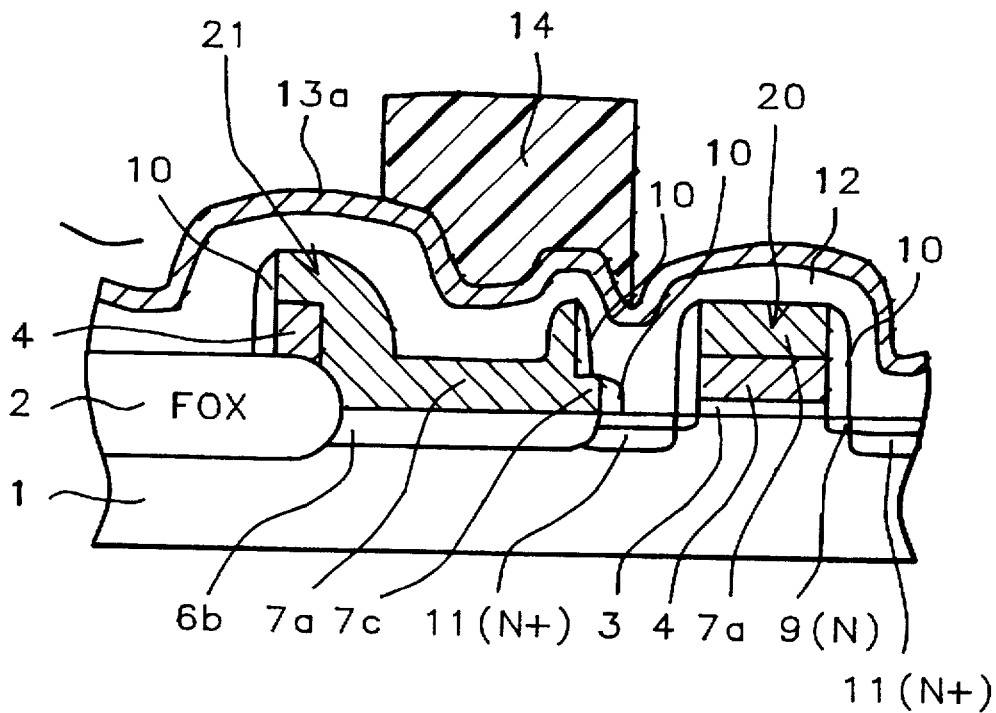

An interlevel silicon oxide layer, 12, is next deposited using either LPCVD or PECVD procedures, at a temperature between about 300° to 700° C., to a thickness between about 1000 to 2000 Angstroms, using TEOS as a source. A second layer of undoped polysilicon, 13a, is deposited using LPCVD procedures, at a temperature between about 500° to 700° C., to a thickness between about 500 to 600 Angstroms. A photoresist shape, 14, is formed to define the shape of a subsequent polysilicon load resistor. These procedures are schematically shown in FIG. 6.

Figure 7:
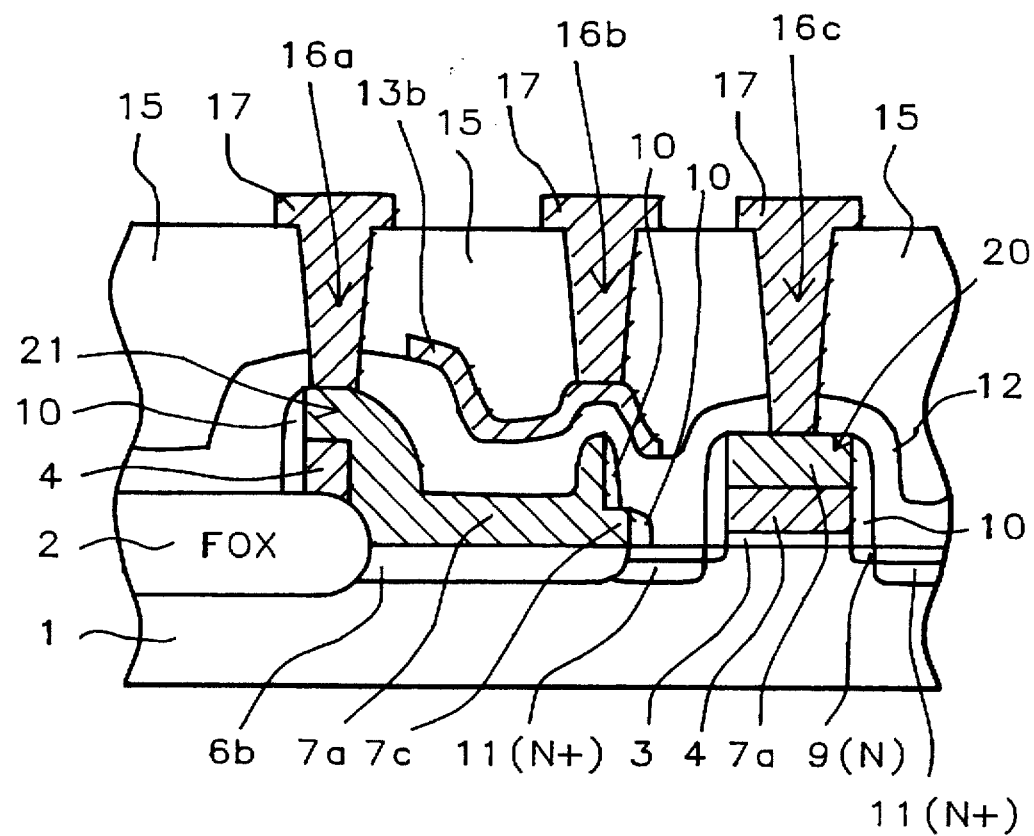

Polysilicon layer, 13a, is then patterned via RIE procedures, using Cl$_2$ as an etchant, creating polysiliocn load resistor, 13b, schematically shown in FIG. 7. After removal of photoresist shape, 14, via plasma oxygen ashing and careful wet cleans, a thick, composite insulator layer, 15, is deposited using PECVD procedures, at a temperature between about 300° to 500° C. Thick composite insulator layer, 15, is comprised of an underlying undoped, silicon oxide layer, obtained using TEOS as a source, to a thickness between about 1000 to 2000 Angstroms, and an overlying layer of boro-phosphosilicate glass, at a thickness between about 3000 to 12000, obtained by the addition of B$_2$H$_6$ and PH$_3$ to the TEOS ambient. An anneal cycle is next performed at a temperature between about 750° to 900° C., in an nitrogen ambient, for purposes of reflowing the BPSG component of the thick, insulator layer, 15, providing a smooth topography, schematically shown in FIG. 7. Contact holes, 16a, 16b, and 16c, are formed in thick, insulator layer, 15, via conventional photolithographic and RIE procedures, using CHF$_3$ as an etchant, exposing the top surface of buried contact structure, 21, polysilicon load resistor, 13b, and polycide gate structure, 20, respectfully. After removal of the photoresist pattern used for contact hole opening, via plasma oxygen ashing and careful wet cleans, a metallization layer, of aluminum, containing between about 1 to 3% copper, and between about 0 to 1% silicon, is deposited using r.f. sputtering procedures, to a thickness between about 4000 to 10000 Angstroms. Conventional photolithographic and RIE procedures, using Cl$_2$ as an etchant, are used to create metal contact structures, 17, shown schematically in FIG. 7. Photoresist removal is again accomplished via plasma oxygen ashing and careful wet cleans.

Although this invention, an improved buried contact process, has been applied to n-channel MOSFET devices, it could easily be applied to p-channel MOSFET devices. A N well region would be formed in the semiconductor substrate, 1, with source and drain regions formed via P type, ion implantation procedures. The buried contact region can also be formed from a heavily doped P type ion implantation process.

While this invention has been particularly shown and described with reference to, the preferred embodiments thereof, it will be understood by those skilled in the art that various changes in form and details may be made without departing from the spirit and scope of this invention.

What is claimed is:

1. A method for fabricating a MOSFET device on a semiconductor substrate, for an SRAM cell, using a buried contact structure, used to connect a MOSFET drain region to a MOSFET gate region, comprising the steps of:

forming a field oxide region in said semiconductor substrate;

growing a gate insulator layer on a region of said semiconductor substrate, not covered by said field oxide region;

depositing a first polysilicon layer on said gate insulator layer and on said field oxide region;

opening a buried contact hole, in said first polysilicon layer, creating a split polysilicon shape, and also opening said buried contact hole in said gate insulator layer, exposing a first portion of said semiconductor substrate;

ion implanting a first conductivity imparting dopant, into said first portion of said semiconductor substrate, to create a buried contact region;

depositing a metal silicide layer on top surface of said split polysilicon shape, and on top surface of said buried contact region, exposed in said buried contact hole, with a thick metal silicide layer forming on the sides of said split polysilicon shape, in said buried contact hole;

forming a first photoresist shape on the top surface of said metal silicide layer, where said metal silicide layer directly overlies said split polysilicon shape, with said first photoresist shape defining a polycide gate structure;

forming a second photoresist shape, to define said buried contact structure, with a first section of said second photoresist shape on top surface of said metal silicide layer, and on top surface of said thick metal silicide layer, in a region where said metal silicide, and said thick metal silicide layer, directly overlie a portion of said buried contact region, while also forming a second section of said second photoresist shape, on said metal silicide layer, where said metal silicide layer directly overlies said split polysilicon shape, on said field oxide region;

a first anisotropic etching procedure, removing said metal silicide layer, and a top portion of said split polysilicon shape, in an area not covered by said first photoresist shape, for a region be used for said polycide gate structure, while removing only a top portion of said thick metal silicide layer, in areas not covered by said first section of said second photoresist shape, leaving a thin metal silicide tab, on a portion of underlying buried contact region, and with said first anisotropic RIE procedure also removing said metal silicide layer, and a top portion of said split polysilicon shape, in region overlying said FOX region, not covered by said second section of said second photoresist shape;

a second anisotropic etching procedure, removing bottom portion of said split polysilicon shape, in an area not covered by said first photoresist shape, to create said polycide gate structure, on underlying gate insulator layer, while removing bottom portion of said split polysilicon shape, on said FOX region, in an area not covered by said second section of said second photoresist shape, creating said buried contact structure, with thin metal silicide tab protecting underlying region of buried contact region from said second anisotropic RIE procedure, in an area not covered by said first section of said second photoresist shape;

removal of said first photoresist shape, and of said second photoresist shape;

ion implanting a second conductivity imparting dopant into regions of said semiconductor substrate not covered by said polycide gate structure, not covered by said buried contact structure, and not covered by said field oxide regions, to create a lightly doped source and drain region;

forming insulator sidewall spacers on the sides of said polycide gate structure, and the sides of said buried contact structure;

ion implanting a third conductivity imparting dopant into regions of said semiconductor substrate, not covered by said polycide gate structure, not covered by said buried contact structure, not covered by said insulator spacers, and not covered by said field oxide region, to create heavily doped source and drain regions, with one heavily doped source and drain region located between said polycide gate structure and said buried contact structure;

depositing an interlevel silicon oxide layer;

depositing a second polysilicon layer on said interlevel silicon oxide layer;

patterning of said second polysilicon layer to form a polysilicon load resistor;

depositing a thick composite insulator layer on said polysilicon load resistor, and on top surface of said interlevel silicon oxide layer, not covered by said polysilicon load resistor;

opening contact holes in said thick composite insulator layer, to expose top surface of said polysilicon load resistor, and opening contact holes in said thick composite insulator layer, and in said interlevel silicon oxide layer, to expose top surface of said polycide gate structure and top surface of said buried contact structure; and forming metal contact structures to said polycide gate structure, to said buried contact structure, and to said polysilicon load resistor.

2. The method of claim 1, wherein said gate insulator layer is silicon dioxide, thermally grown in an oxygen steam ambient, at a temperature between about 850° to 1000° C., to a thickness between about 50 to 200 Angstroms.

3. The method of claim 1, wherein said first polysilicon layer is grown using LPCVD procedures, at a temperature between about 500° to 700° C., to a thickness between about 750 to 1250 Angstroms, using in situ doping procedures comprised of adding either arsine or phosphine, to a silane ambient.

4. The method of claim 1, wherein said first conductivity imparting dopant, used to create said buried contact region, is phosphorous, ion implanted at an energy between about 30 to 80 KeV, at a dose between about 1E14 to 3E15 atoms/cm$^2$.

5. The method of claim 1, wherein said metal silicide layer is tungsten silicide deposited using LPCVD procedures, at a temperature between about 400° to 600° C., to a thickness between about 750 to 1250 Angstroms, with said thick tungsten silicide formed to a thickness between about 1500 to 2500 Angstroms, using tungsten hexafluoride and silane as a source.

6. The method of claim 1, wherein said metal silicide layer is a composite layer, comprised on an underlying polysilicon layer, deposited using LPCVD procedures, at a temperature between about 500° to 700° C., to a thickness between about 25 to 75 Angstroms, using in situ doping procedures by the incorporation of either arsine or phosphine to a silane ambient, and comprised of an overlying tungsten silicide layer, deposited using LPCVD procedures, at a temperature between about 400° to 600° C., to a thickness between about 750 to 1250 Angstroms, using tungsten hexafluoride and silane as a source.

7. The method of claim 1, wherein said first anisotropic etching procedure, used for the initial phase of creating said polycide gate structure, is performed using $Cl_2$ in $N_2$ as an etchant, at a power between 170 to 250 watts, and at a pressure between about 3 to 5 milliTorr, completely removing said metal silicide layer, and a top portion of said underlying, split polysilicon shape, leaving between about 200 to 600 Angstroms, of said split polysilicon shape unetched, while said first anisotropic RIE procedure, used for the initial phase of creating said buried contact structure, removes between about 1250 to 1500 Angstroms of said thick metal silicide layer, leaving said thin metal silicide tab, between about 250 to 1250 Angstroms, in thickness, on said underlying buried contact region, and leaving between about 200 to 600 Angstroms of said split polysilicon shape, unetched and overlying said FOX region.

8. The method of claim 1, wherein said second anisotropic etching procedure, used to remove between about 200 to 600 Angstroms of said split polysilicon shape to complete the formation of said polycide gate structure, and said buried contact structure, is performed using HBr and He as etchants, with an etch rate ratio, for polysilicon to metal silicide, of about 50 to 1.

9. The method of claim 1, wherein said third conductivity imparting dopant, used to create said heavily doped source and drain regions, is arsenic or phosphorous, ion implanted at an energy between about 30 to 100 KeV, at a dose between about 1E15 to 6E15 atoms/cm$^2$.

10. The method of claim 1, wherein said second polysilicon layer, used for the creation of said polysilicon load resistor, is deposited using LPCVD procedures, at a temperature between about 500° to 700° C., to a thickness between about 500 to 600 Angstroms.

11. A method for fabricating a buried contact structure, for a MOSFET device, on a semiconductor substrate, using a thick tungsten silicide layer, on the sides of a split polysilicon shape, and using selective anisotropic etching procedures, for patterning of tungsten silicide, and of said split polysilicon layer, to create said buried contact structure, comprising the steps of:

forming a field oxide region in said semiconductor substrate;

growing a gate insulator layer on region of said semiconductor substrate, not covered by said field oxide region;

depositing a polysilicon layer;

patterning of said polysilicon layer to create said split polysilicon shape;

removal of said gate insulator layer in regions not covered by said split polysilicon shape, to expose a buried contact opening to said semiconductor substrate;

ion implanting a first conductivity imparting dopant into said semiconductor substrate, in region exposed by said buried contact opening, to create a buried contact region, in said semiconductor substrate;

depositing said tungsten silicide layer on top surface of said split polysilicon shape, and on top surface of said buried contact region, with said thick tungsten silicide layer forming on the sides of said split polysilicon shape, in said buried contact opening;

forming a photoresist shape, to define said buried contact structure, with a first section of said photoresist shape on the top surface of said tungsten silicide, and on the top surface of said thick tungsten silicide layer, in an area overlying said buried contact region, and with a second section of said photoresist shape, on a the top surface of said tungsten silicide layer, in an area in which said tungsten silicide layer overlies said split polysilicon shape, on said FOX region;

a first anisotropic etching procedure, removing top portion of said thick tungsten silicide layer, in areas not covered by said first section of said photoresist shape, leaving a thin tungsten silicide tab, overlying a portion of underlying said buried contact region, while completely removing said tungsten silicide layer, and a top portion of underlying said split polysilicon shape, on said FOX regions, in an area not covered by said second section, of said photoresist shape;

a second anisotropic etching procedure, forming said buried contact structure, by removing remaining portion of said split polysilicon shape, from said FOX region, in an area not covered by said second section of said photoresist shape, while said thin tungsten silicide tab protects underlying buried contact region from said second anisotropic etching procedure; and ion implanting a second conductivity imparting dopant into a region between said buried contact structure, and a MOSFET polycide gate structure, to provide a conductive link between said buried contact region and gate region of said MOSFET device.

12. The method of claim 11, wherein said polysilicon layer is grown using LPCVD procedures, at a temperature between about 500° to 700° C., to a thickness between about 750 to 1250 Angstroms, using in situ doping procedures comprised of adding either arsine, or phosphine, to a silane ambient.

13. The method of claim 11, in which said split polysilicon shape is formed via anisotropic etching procedures performed to said polysilicon layer, using $Cl_2$ as an etchant.

14. The method of claim 11, wherein said first conductivity imparting dopant is phosphorous, ion implanted at an energy between about 30 to 80 KeV, at a dose between about 1E14 to 3E15 atoms/$cm^2$.

15. The method of claim 11, wherein said tungsten silicide layer is deposited using LPCVD procedures, at a temperature between about 400° to 600° C., using tungsten hexafluoride and silane as a source, and to a thickness between about 750 to 1250 Angstroms, on the top surface of said split polysilicon layer, and with said thick tungsten silicide layer forming on the sides of said split polysilicon shape, to a thickness between about 1500 to 2500 Angstroms.

16. The method of claim 11, wherein a thin polysilicon layer is used underlying said tungsten silicide layer, with said thin polysilicon layer being deposited using LPCVD procedures, at a temperature between about 500° to 700° C., to a thickness between about 25 to 75 Angstroms, and grown using in situ doping procedures by the addition of either arsine, or phosphine, to a silane ambient.

17. The method of claim 11, wherein said first anisotropic etching procedure, used for the initial phase of defining said buried contact structure, is performed using $Cl_2$ in $N_2$ as an etchant, at a power between about 170 to 250 watts, and at a pressure between about 3 to 5 milliTorr, removing between about 1250 to 2500 Angstroms of said thick tungsten silicide layer, leaving a thin tungsten silicide tab, between about 250 to 1250 Angstroms in thickness, in an region overlying buried contact region, while completely removing said tungsten silicide layer, and leaving between about 200 to 600 Angstroms of said split polysilicon shape unetched, in an region overlying said FOX region.

18. The method of claim 11, wherein said second anisotropic RIE procedure, used to completely define said buried contact structure, is performed using HBr and He as etchants, at a power between about 180 to 250 watts, and at a pressure between about 40 to 60 milliTorr, removing between about 200 to 600 Angstroms of said split polysilicon shape, with a etch rate ratio of polysilicon to tungsten silicide of about 50 to 1.

19. The method of claim 11, wherein said second conductivity imparting dopant, used to create a conductive link between said buried contact region and said MOSFET polycide gate structure, is arsenic or phosphorous, ion implanted at an energy between about 30 to 100 KeV, at a dose between about 1E15 to 6E15 atoms/$cm^2$.

* * * * *